(12) United States Patent
Holliday

(10) Patent No.: US 8,956,444 B2
(45) Date of Patent: Feb. 17, 2015

(54) VENTING ARRAY AND MANUFACTURING METHOD

(71) Applicant: Gore Enterprise Holdings, Inc., Newark, DE (US)

(72) Inventor: Andrew J. Holliday, Wilmington, DE (US)

(73) Assignee: W. L. Gore & Associates, Inc., Newark, DE (US)

(*) Notice: Subject to any disclaimer, the term of this patent is extended or adjusted under 35 U.S.C. 154(b) by 116 days.

(21) Appl. No.: 13/795,580

(22) Filed: Mar. 12, 2013

(65) Prior Publication Data

US 2013/0263996 A1 Oct. 10, 2013

Related U.S. Application Data

(60) Provisional application No. 61/610,254, filed on Mar. 13, 2012.

(51) Int. Cl.
*B01D 53/22* (2006.01)
*B81B 7/00* (2006.01)
*B32B 3/26* (2006.01)
*B23B 3/00* (2006.01)

(52) U.S. Cl.
CPC .............. *B81B 7/0058* (2013.01); *B32B 3/266* (2013.01); *B23B 3/00* (2013.01)
USPC ............................................................ 96/11

(58) Field of Classification Search
CPC .... B01D 53/22; B01D 53/228; B01D 63/082; B01D 71/022; C01B 3/505
USPC ............................................................ 96/11
See application file for complete search history.

(56) References Cited

U.S. PATENT DOCUMENTS

| | | | |
|---|---|---|---|
| 3,953,566 A | 4/1976 | Gore | |
| 4,613,544 A * | 9/1986 | Burleigh | 428/315.5 |
| 4,629,330 A * | 12/1986 | Nichols | 368/89 |
| 5,082,472 A * | 1/1992 | Mallouk et al. | 95/49 |
| 5,449,427 A * | 9/1995 | Wojnarowski et al. | 156/155 |
| 5,453,333 A * | 9/1995 | Takauchi et al. | 429/62 |
| 5,931,862 A * | 8/1999 | Carson | 607/120 |
| 6,177,181 B1 * | 1/2001 | Hamada et al. | 428/304.4 |
| 6,306,729 B1 * | 10/2001 | Sakaguchi et al. | 438/458 |
| 6,429,095 B1 * | 8/2002 | Sakaguchi et al. | 438/458 |
| 6,662,635 B2 * | 12/2003 | Mansky | 73/61.41 |
| 7,434,305 B2 | 10/2008 | Minervini | |
| 8,298,657 B2 * | 10/2012 | Bonner et al. | 428/314.2 |
| 2002/0062154 A1 * | 5/2002 | Ayers | 623/23.76 |
| 2002/0068419 A1 * | 6/2002 | Sakaguchi et al. | 438/458 |
| 2003/0074081 A1 * | 4/2003 | Ayers | 623/23.5 |
| 2004/0028875 A1 * | 2/2004 | Van Rijn et al. | 428/98 |
| 2006/0237130 A1 * | 10/2006 | Thompson | 156/273.3 |
| 2006/0252044 A1 * | 11/2006 | Okumura et al. | 435/6 |
| 2011/0177398 A1 * | 7/2011 | Affinito et al. | 429/325 |
| 2012/0070746 A1 * | 3/2012 | Mikhaylik et al. | 429/231.95 |
| 2012/0121999 A1 * | 5/2012 | Laurencin et al. | 429/423 |
| 2013/0166021 A1 * | 6/2013 | Bruchman et al. | 623/2.12 |
| 2013/0325117 A1 * | 12/2013 | Bruchman et al. | 623/2.17 |
| 2014/0079922 A1 * | 3/2014 | Wang et al. | 428/201 |
| 2014/0255780 A1 * | 9/2014 | Mikhaylik et al. | 429/213 |

* cited by examiner

*Primary Examiner* — Jason M Greene
*Assistant Examiner* — Anthony Shumate
(74) *Attorney, Agent, or Firm* — Amy L. Miller

(57) ABSTRACT

The invention relates to a vent array comprising a plurality of venting regions comprising a porous PTFE matrix material and a nonporous material comprising a substrate material having a plurality of perforations, wherein the substrate material fills the pores of a porous PTFE matrix material to form nonporous regions, the nonporous regions interconnecting the plurality of venting regions.

17 Claims, 4 Drawing Sheets

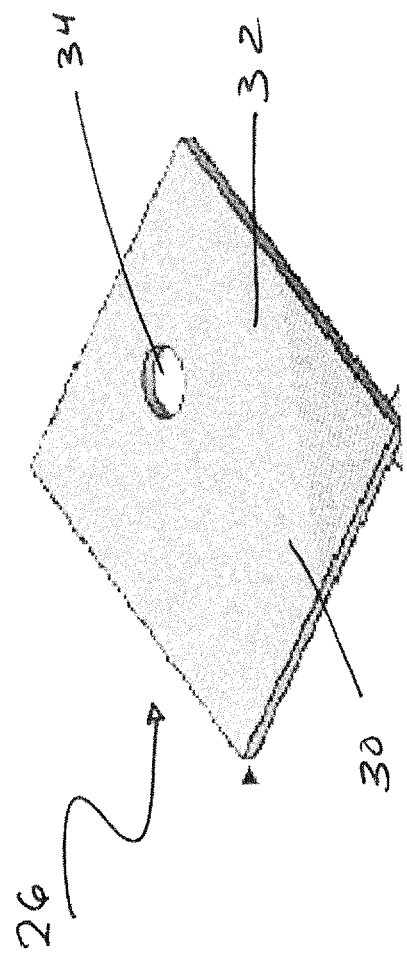

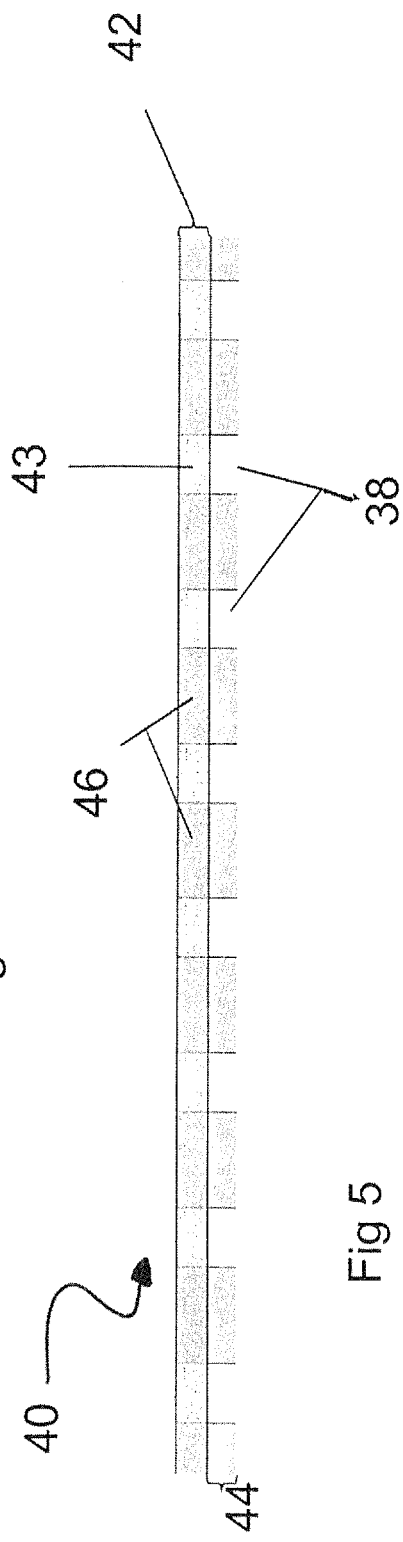
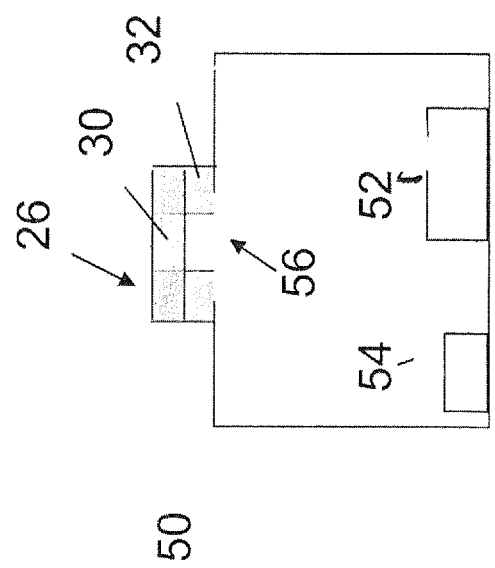

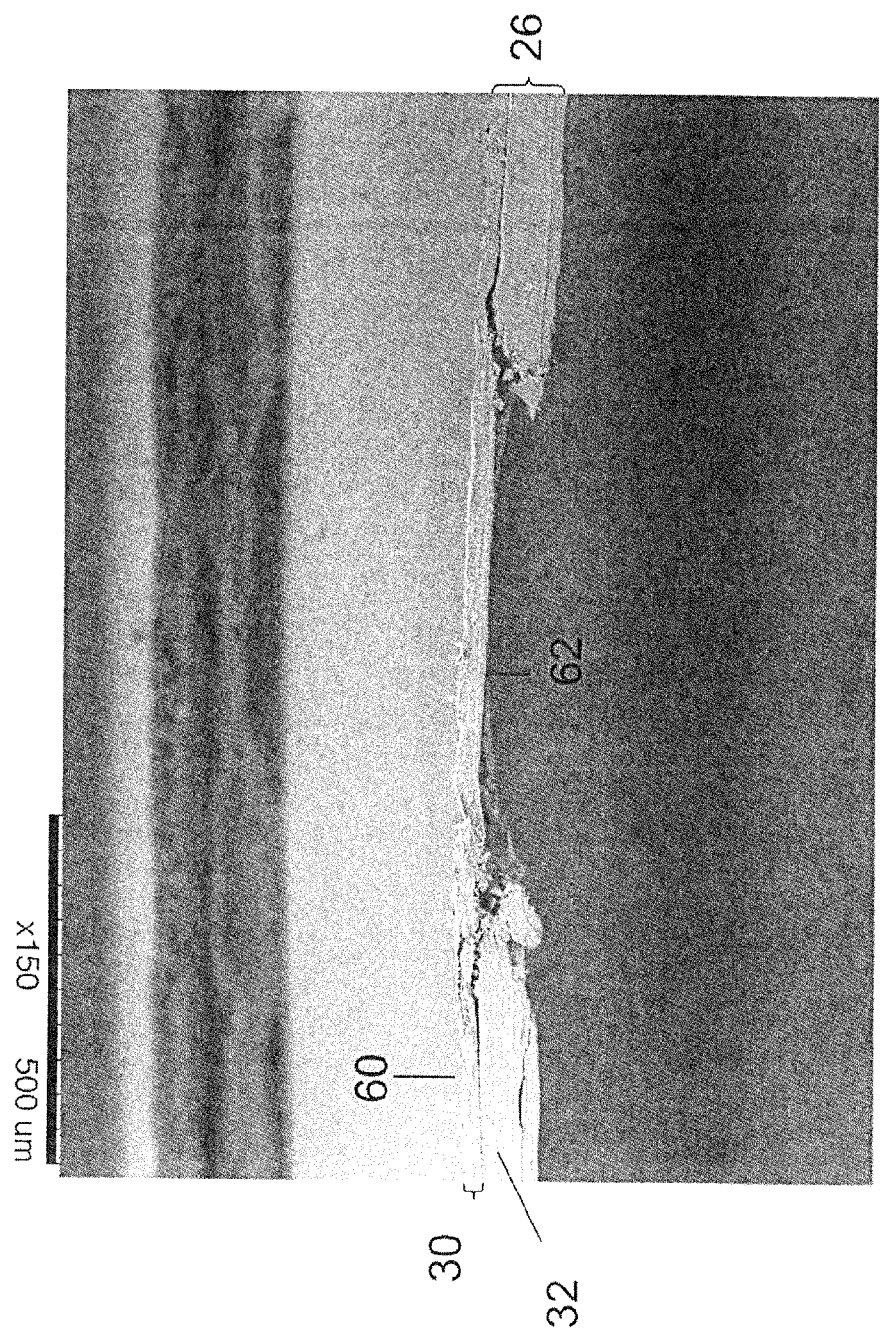

VENTING ARRAY AND MANUFACTURING METHOD

RELATED APPLICATIONS

This application claims priority to U.S. Provisional Patent Application No. 61/610,254 filed Mar. 13, 2012, entitled "VENTING ARRAY AND MANUFACTURING METHOD," which is incorporated herein by reference in its entirety.

BACKGROUND OF THE INVENTION

The integration of mechanical elements, sensors, actuators or the like and electronics on a common silicon substrate through micro-fabrication technology is known as MEMS. Micro-electro-mechanical system sensors may be used in microphones, consumer pressure sensor applications, tire pressure monitoring systems, gas flow sensors, accelerometers, and gyroscopes.

U.S. Pat. No. 7,434,305 describes a silicon condenser microphone MEMS package including an acoustic transducer and acoustic port. The acoustic port further includes an environmental barrier such as PTFE or a sintered metal to protect the transducer from environmental elements such as sunlight, moisture, oil, dirt, and/or dust.

The barrier is generally sealed between layers of conductive or non-conductive materials using adhesive layers. The disclosed condenser microphones may be attached to the circuit board using reflow soldering. Reflow soldering is performed at relatively high temperatures. Accordingly the temperature resistance of such adhesive layers is critical. The high temperature experienced in reflow soldering conditions combined with the low mechanical strength of the barrier itself has made incorporation of environmental barriers into MEMS packages in this manner quite difficult.

A need still exists for environmental protection and pressure equalization capability in a thin form factor as required by a MEMS package. Furthermore, there is a need to manufacture small venting devices in an efficient manner. The vents array disclosed herein fulfill such needs.

BRIEF DESCRIPTION OF THE DRAWINGS

FIG. 3 shows a venting device.

FIG. 4 shows a cross section of a vent array.

FIG. 5 is another aspect describing a vented MEMS package.

FIG. 6 shows a cross-sectional SEM image of the vent array.

DETAILED DESCRIPTION OF THE INVENTION

Figure 1:
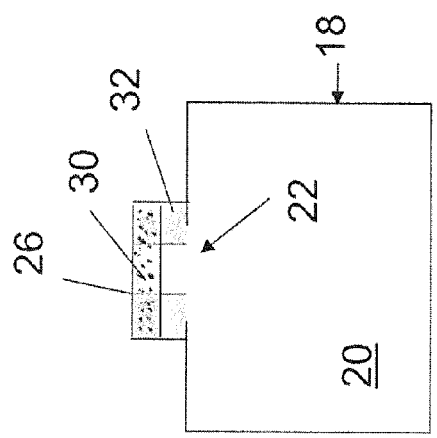
FIG. 1 depicts one embodiment of the invention, a vent attached to a MEMS package.

In one embodiment, the present invention relates to a method of manufacturing a venting device for a container. In particular, a venting device suitable for MEMS package may be made by the inventive process. FIG. 1 shows such a container (18) with an internal space (20) space and an aperture (22) which separates the internal space from the ambient space (24). Examples of containers may include, but are not limited to, pressure sensors, electronic enclosures, gas sensors, microphones, and hearing aid devices.

Figure 2:
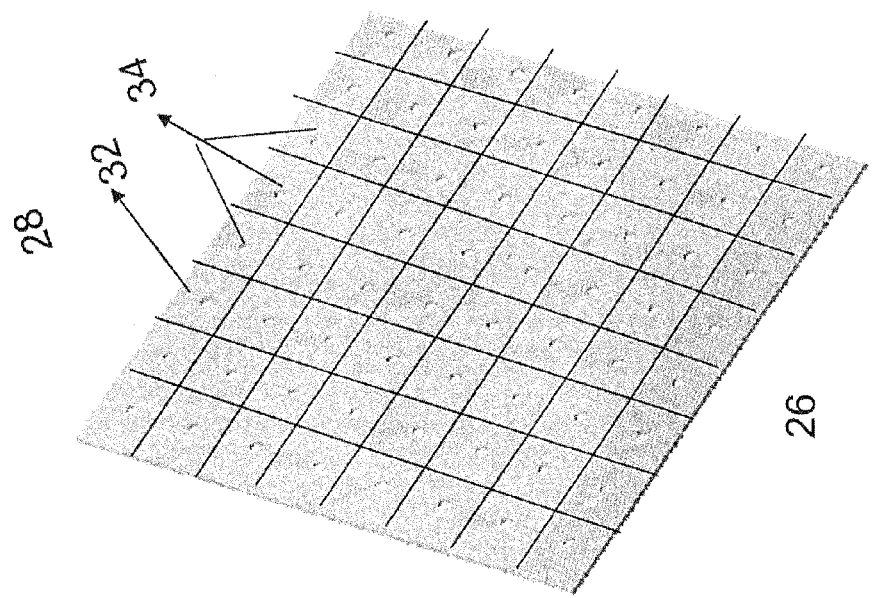
FIG. 2 is a depiction of the vent array.

FIG. 2 depicts the vent array. The array comprises multiple vents manufactured in a single process. The vents may be separated by cutting or dicing prior to installation or may be installed upon an array of MEMS packages prior to separation.

A venting device (26) such as depicted in FIG. 3 may be placed over the aperture (22) in a container. The venting device serves to protect the internal space of the container from contaminants in the ambient space including dust, moisture, and other liquids while allowing gas flow for pressure equalization or moisture transmission. The device (26) may be provided in the form of a vent array (28) comprising several venting devices as shown in FIG. 2. The vent array may be constructed by combining a porous polymeric matrix material (30) and a substrate material (32) having a plurality of perforations (34).

The porous polymeric matrix material is a liquid impermeable, gas permeable material. Porous polymeric matrix materials may be fluoropolymers like PTFE, PVDF, PFA, FEP, and copolymers thereof. These porous polymeric matrix materials may be provided as a single layer or multi-layered structures comprising of layers of varying porosity and or varying polymeric materials. The layers may be symmetric or asymmetric layers. Expanded PTFE membranes made according to the teachings of U.S. Pat. No. 3,953,566 to Gore are particularly useful as the porous material. These PTFE membranes may be uni-axially or bi-axially expanded. The porous materials may be rendered oleophobic by applying a polymeric coating using coatings and methods well known in the art.

Copolymers of PTFE may also be useful. As used herein, PTFE includes copolymers and expanded copolymers of PTFE as would be understood by those of skill in the art.

The substrate material may be any polymeric material which can flow into and fill in the pores of the porous polymeric matrix upon combining the two sets of materials under heat and or pressure. For example, the substrate may be a thermoplastic. The substrate material may be any dielectric material made from high temperature organic dielectric substrate materials such as, but not limited to, polyimides, epoxy resins, comprised at least in part of PTFE, with or without a filler.

Speedboard® material is a particularly useful substrate. GORE® SPEEDBOARD® C prepreg materials are sheets of expanded PTFE impregnated with thermoset resins. The air space inside the expanded PTFE is replaced with resin, and the expanded PTFE membrane becomes the carrier or the delivery system for the resin. The resin flows, fills, and bonds during the lamination process in the same way as conventional glass-based prepreg.

The substrate material may also comprise partially cured and fully cured materials. Substrate materials may include Stage B FR4/BT and Tacpreg—Taconic. The thickness range of the substrate may be from 15 micron to 200 micron. Preferably, the thickness of the substrate is between 30 micron and 80 micron.

Perforations are created on a sheet of the substrate material by means such as laser drilling, die-punching, or mechanical drilling. The size, shape, and location of the perforations may depend on the size and shape of the aperture (22) of the venting device. Typically, the size of the perforations may range from 0.3 mm to 1.5 mm. The perforation shape is not critical and may take any shape such as circular, oval, square, rectangular, etc.

As illustrated in FIG. 4, the vent array (40) is created by combining the porous polymeric material matrix (42) and the perforated substrate (44) together by lamination or calendaring techniques. Such techniques may involve heat or pressure or both. Perforations (38) result in vents for gas pressure and to allow acoustic transmission. The substrate and matrix material are combined to form a composite. The substrate material flows into and fills the voids of the porous polymeric material in some regions. The resultant composite, thereby comprises regions of porous polymeric material (43) and nonporous regions (46) wherein the porous polymeric material is substantially filled with the substrate material.

As shown in FIG. 2, the vent array (28) may comprise a plurality of venting devices (26), each device comprising at least one porous region of polymeric material. The number of venting devices per array depends on the size of the vent assembly. The venting devices may be separated from the array by dicing or cutting and attached to a container using known means such as adhesives, heat welding, or by flowing and curing the substrate to the container.

In an aspect, attachment features such as metal lids or sheets of thermoplastic or epoxy may be provided to the vent array to facilitate attachment of the venting device to the package. In another aspect, the individual venting device with the attachment features may be diced from the vent array by known methods and the device is then used to cover an aperture of a container.

Another aspect of the present invention relates to a method of manufacturing a vented MEMS package. FIG. 5 shows an exemplary MEMS condenser microphone package (50) including a transducer unit (52) and an amplifier (54). The package has an acoustic port or aperture (56) for allowing sound waves to reach the transducer. Other MEMS packages for other applications, such as MEMS speakers, are similarly configured and contemplated by the inventive manufacturing method. The aperture is covered with the venting device (26) to allow sound waves or gases to pass through but prevent liquid contaminants, dust, and moisture from entering the package, thereby protecting the contents inside the package.

EXAMPLE

Method of Making a Vent Array

A prepreg material (GORE™ SPEEDBOARD® C) was used as the substrate. Circular perforations of diameter 0.8 mm were drilled into the substrate (12.7 cm by 15.2 cm in size) by using a $CO_2$ laser. The substrate had a total of 1755 such perforations which were spaced 3.25 mm apart from each other. An expanded PTFE membrane was used as the porous polymeric matrix material, the properties of the membrane are as follows: about 35 micron thickness, average pore size of 0.5 micron, Gurley of about 10 secs. The expanded PTFE membrane was rendered oleophobic by coating with a solution of fluoroacrylate polymer in a solvent system and subsequently removing the solvent by drying.

Using a manual Carver press, a composite was created by pressing the perforated substrate against this layer of oleophobic expanded PTFE membrane at a temperature of 200 degrees F., under a pressure of 1600 psi for approximately 4 minutes and 45 seconds. The substrate material (32) penetrated through the entire thickness of the oleophobic membrane (30) as observed in the cross-sectional SEM image of the composite shown in FIG. 6. Thus, the resultant composite had (a) nonporous regions (60) where the substrate material had penetrated through the membrane, and (b) air permeable porous regions (62) of just the oleophobic membrane which corresponded to the perforation in the substrate material.

What is claimed is:

1. A vent array comprising:
   a. a plurality of venting regions comprising a porous PTFE matrix, and
   b. a nonporous matrix material comprising a substrate material having a plurality of perforations, wherein the substrate material fills the pores of the porous PTFE matrix to form nonporous regions, the nonporous regions interconnecting the plurality of venting regions.

2. The vent array of claim 1 in which the porous PTFE matrix is oleophobic.

3. The vent array of claim 1 in which the substrate material is a dielectric material.

4. The vent array of claim 1 in which the substrate material is an epoxy.

5. The vent array of claim 1 in which the substrate material is polyimide.

6. The vent array of claim 1 having a thickness of less than 200 micron.

7. The vent array of claim 1 further comprising an attachment layer.

8. A vent array that is gas permeable comprising:
   a plurality of venting regions comprising a porous polymeric matrix material that is liquid impermeable and gas permeable, and
   a nonporous matrix material comprising a substrate material having a plurality of gas permeable perforations, wherein the substrate material fills pores of the porous polymeric matrix material in some regions to form nonporous regions, the nonporous regions interconnecting the plurality of venting regions.

9. The vent array of claim 8 wherein the porous polymeric matrix material comprises a porous PTFE matrix.

10. The vent array of claim 9 wherein the porous PTFE matrix is oleophobic.

11. The vent array of claim 8 wherein the substrate material comprises a thermoplastic.

12. The vent array of claim 8 wherein the substrate material comprises a dielectric material.

13. The vent array of claim 8 wherein the substrate material comprises an epoxy.

14. The vent array of claim 8 wherein the substrate material comprises polyimide.

15. The vent array of claim 8 having a thickness of less than 200 micron.

16. The vent array of claim 8 further comprising an attachment layer.

17. The vent array of claim 8 wherein the porous polymeric material matrix is laminated to the substrate material.

* * * * *